United States Patent [19]
Chiu et al.

[11] Patent Number: 6,121,678
[45] Date of Patent: *Sep. 19, 2000

[54] WRAP-AROUND INTERCONNECT FOR FINE PITCH BALL GRID ARRAY

[75] Inventors: Anthony Chiu, Richardson; Tom Quoc Lao, The Colony; Harry Michael Siegel, Hurst; Michael J. Hundt, Double Oak, all of Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/994,741

[22] Filed: Dec. 19, 1997

[51] Int. Cl.⁷ ..................................................... H05K 3/34
[52] U.S. Cl. .......................... 257/700; 257/698; 361/720; 361/736
[58] Field of Search ...................................... 361/720, 736, 361/748; 257/700, 698, 697, 666

[56] References Cited

U.S. PATENT DOCUMENTS

| | | |
|---|---|---|
| 4,288,841 | 9/1981 | Gogal . |
| 4,420,652 | 12/1983 | Ikeno . |
| 4,939,792 | 7/1990 | Urbish . |
| 5,635,670 | 6/1997 | Kubota et al. . |
| 5,725,640 | 3/1998 | Joshi . |
| 5,729,896 | 3/1998 | Dalal et al. . |

*Primary Examiner*—Stephen D. Meier
*Attorney, Agent, or Firm*—Theodore E. Galanthay; Lisa K. Jorgenson; Dan Venglarik

[57] ABSTRACT

An apparatus and method for producing a wrap-around interconnect substrate (60) comprising a substrate (42) having semi-circular vias (62) having openings (64) created by separating through cylindrical vias (62) that were positioned along cutting lines (46*a*, 46*b*) that formed part of an integrated circuit substrate strip (40) prior to separation, is disclosed.

19 Claims, 3 Drawing Sheets

WRAP-AROUND INTERCONNECT FOR FINE PITCH BALL GRID ARRAY

TECHNICAL FIELD OF THE INVENTION

This invention relates, in general, to the field of integrated circuit packages and, more particularly, to a wrap-around interconnected design for conventional ball grid array based integrated circuit manufacturing.

BACKGROUND OF THE INVENTION

During the manufacture and assembly of integrated circuits, the packaging process is one of the most critical steps. In fact, the cost of packaging an integrated circuit package can easily exceed the cost of manufacturing the integrated circuit chip. The increase in cost is due to the fact that the majority of device failures are generally packaging oriented. Therefore, there is a need for improved methods for packaging integrated circuits that reduce the cost of manufacturing and increase the reliability of the device.

A key step in integrated circuit fabrication is packaging the silicon chip in a manner that protects it in subsequent manufacturing steps and from the environment of its intended application. A critical step in the packaging process involves the inter-connection between the integrated circuit silicon chip and the board or substrate to which it is connected.

The packaging of an integrated circuit generally involves attaching an individual chip to a lead frame where, following wire bonding and encapsulation, designated parts of the lead frame become the terminals of the package. Additionally, due to the increased miniaturization of integrated circuits, there has been a need to reduce both the size of the inter-connects between the silicon chip and the substrate, and also of the routing lines on the substrate. Concomitantly with the routing lines, the creation of vias within the substrate requires increased miniaturization.

U.S. Letters Pat. No. 5,561,594 (SGS-Thomson Microelectronics, Ltd.) discloses an electrical assembly in which the electrical component is mounted on a multi-layer printed circuit board having a plurality of conducting pins located in perforations within the board. The conducting pins located in the board have pointed ends that project above the board and make electric contact with solder bumps on the electrical component. While this specification describes an apparatus and method for flip-chip packaging, it does not address the need for smaller vias for use with high performance semi-conductor products. Furthermore, it uses conventional methods to create a printed circuit board. As with conventional manufacturing, the printed circuit board has standard size vias that are drilled through for each individual substrate increasing processing time.

U.S. Pat. No. 5,621,193 (Northrop Grumman Corp.) discloses a method for electrically connecting surface conductors to edge conductors by use of an intersecting side non-conductor substrate having a through hole in the substrate and metalization of the through hole. The electrical connections between the surface and the side include forming an intersecting ceiling plug in the via prior to cutting the intersecting side. The wraparound conduits as described, however, are vulnerable to damage during subsequent handling of the semi-conductor. Furthermore, the specification does not address the need to improve integrated circuit packaging.

Thus, it has been recognized herein that a need has arisen for a simple, effective apparatus and method for providing a substrate for interconnecting integrated circuits using fine pitch ball grid array (BGA) technology. The need has also arisen for a more versatile package for medium to high performance semi-conductors, and for substrates and methods of manufacturing substrates with increased efficiency and decreased cost. Furthermore, a need has arisen for a substrate that can be made using present equipment and using standard manufacturing techniques, but which decreases the number of drilling and cutting steps involved in the formation of via interconnects in substrates.

SUMMARY OF THE INVENTION

The present invention can provide a simple, effective apparatus and method for interconnecting medium to high performance semi-conductors to substrates using fine pitch ball grid array (BGA). The present invention can increase the efficiency of the production in manufacture of substrates for use with fine pitch BGA assemblies. The present invention can also decrease the processing time and materials needed during the manufacture of the substrate for fine pitch BGA assembly.

More particularly, the present invention is directed to an integrated circuit substrate having first and second surfaces and an edge comprising one or more semi-circular vias at a substrate edge. The one or more semi-circular vias extend between the first and the second surfaces of the substrate and are used to electrically connect routing strips or conduits on the first and second surfaces of the substrate. The semi-circular vias are created by separating the one or more vias at the substrate edge.

In one embodiment of the present invention, the substrate is further defined as comprising routing strips integral to the substrate that connected to the one or more semi-circular vias on the first and second surfaces of the substrate. The substrate can be a high temperature epoxy that may be mixed with glass fibers. The high temperature epoxy substrate can be made of, e.g., a bismalimide triazine or an FR-4 resin.

The integrated circuit package for use with the present invention may further comprise, a silicon chip attached to the first surface of the substrate, the silicon chip having one or more bonding pads. Wire bonding electrically connects the bonding pads on the silicon chip with routing strips on the first surface of the substrate. The second side of the substrate may also comprises a ball grid array to electrically connected to one or more of the semi-circular vias.

An alternative embodiment of the present invention is an integrated circuit substrate strip comprising, two or more substrate units, each unit having at least one edge, wherein the edge of the two or more units is at least partially defined by one or more conductive vias located on the common edge of the two or more units. The semi-circular vias are formed by separating or cutting the one or more vias at the common edge of the units.

The present invention also includes a method for creating and integrated circuit substrate comprising, obtaining a board having at least two integrated circuit substrate unit portions, drilling at least one via hole between the substrate unit portions and separating the unit portions of the board at the at least one via to separate the two integrated circuit substrate unit portions. After separation each unit portion has a semi-circular via that connects the surfaces of the substrate. In another embodiment of the present method the via is made electrically conductive prior to separating the unit portions.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
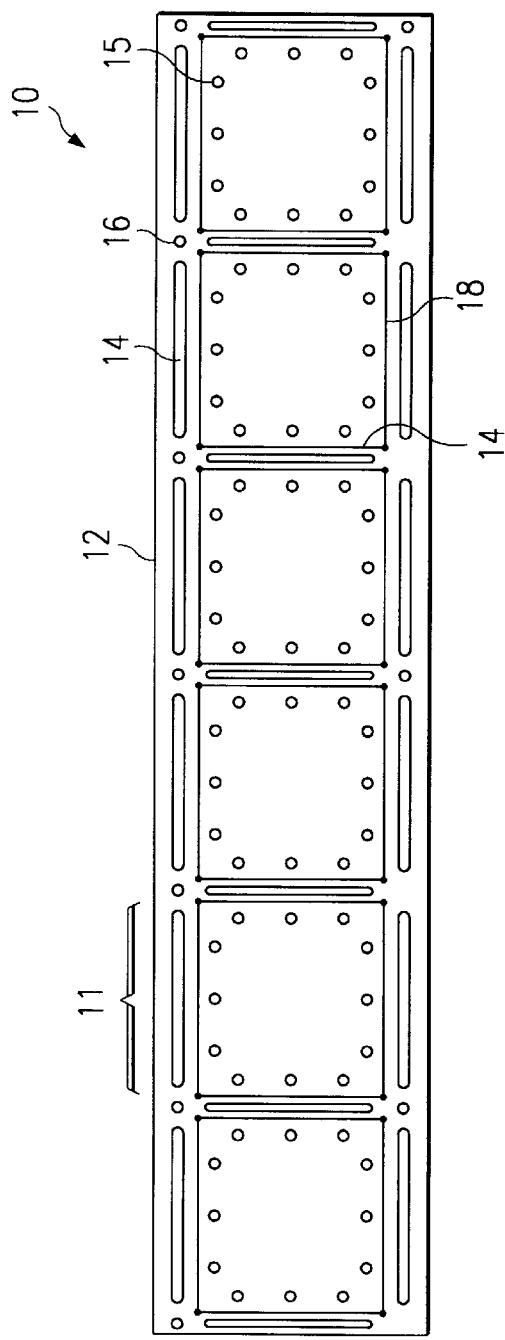
FIG. 1 is a top view of a substrate strip of the prior art.

FIG. 1 shows a top view of a prior art strip 10, i.e., a printed circuit board (PCB) substrate, before any components have been adhered or added to the substrate 12. Here, six units 11 are shown on strip 10. Each unit 11 is surrounded by open areas 14. The open areas 14 form a box surrounding and defining each unit 11. At the corners of each unit 11 are alignment holes 16 that serve to help in handling the printed circuit board strip 10 during processing. The open areas 14 that define each unit 11 also serve to reduce the amount of PCB substrate material used in the strip 10 as will facilitate the removal of the complete package from the strip 10.

Figure 2:
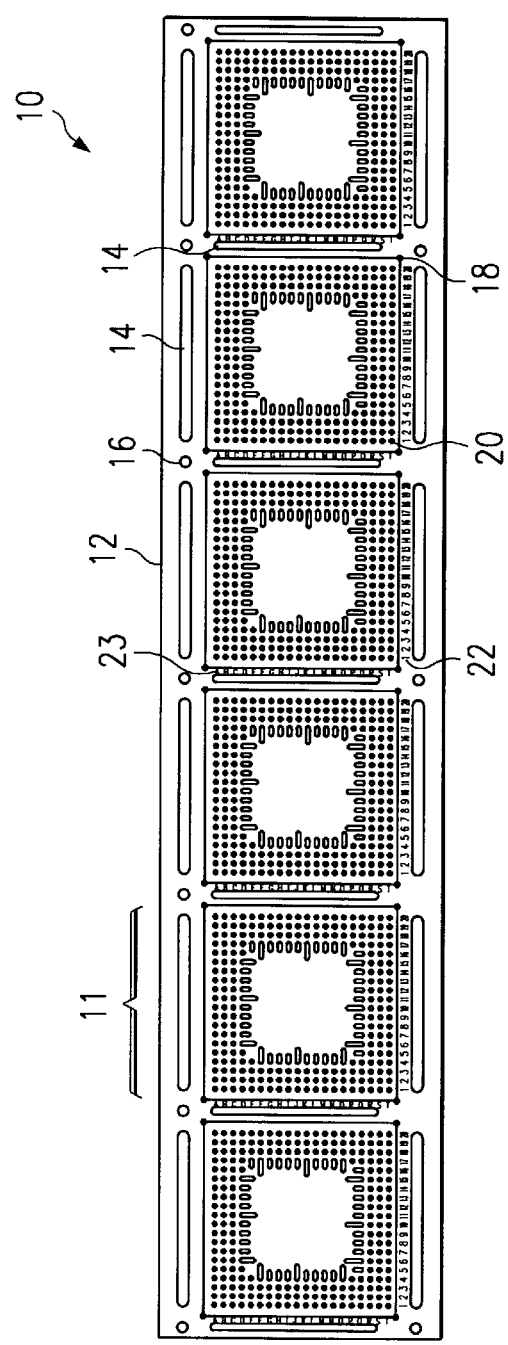
FIG. 2 is a bottom view of a prior art substrate strip.

FIG. 2 depicts a bottom view of the prior art strip 10. Units 11 are formed on the printed circuit PCB substrate 12 by open areas 14. The alignment holes 16 at the corners of each unit 11 help define the usable surface area of the substrate defined by outline 18 (FIG. 1 and FIG. 2). The electrical contacts 20 depicted in the form of a ball grid array (BGA) are shown within outline 18. Numbering 22 and lettering 23 located outside of outline 18 help to orient the unit 11 during subsequent processing.

In order to form the interconnections between the top and bottom of the printed circuit board units 11, vias 15 (FIG. 1, not shown in FIG. 2 for clarity) are created by drilling through the printed circuit board substrate 12, thereby creating an opening through which copper can be deposited by electroless plating. The copper plating in the openings interconnects the metallic electrically-conductive print of the top and bottom surfaces of the printed circuit board substrate 12.

To create the open spaces 14 that define the units 11, a group of four cutting operations with a router must be conducted for each individual unit 11. The units 11 can then be separated by a punching operation or by cutting with a router. After the vias 15 have been drilled and the connections made, the units 11 are separated by cutting the substrate 12 along the open spaces 14. The tooling holes 16 help to facilitate the correct placement of the strip 10 in the correct position at various processing steps. Additionally, the strip 10 can have other markings that serve as alignment guides (not shown) to facilitate further processing steps.

Figure 3:
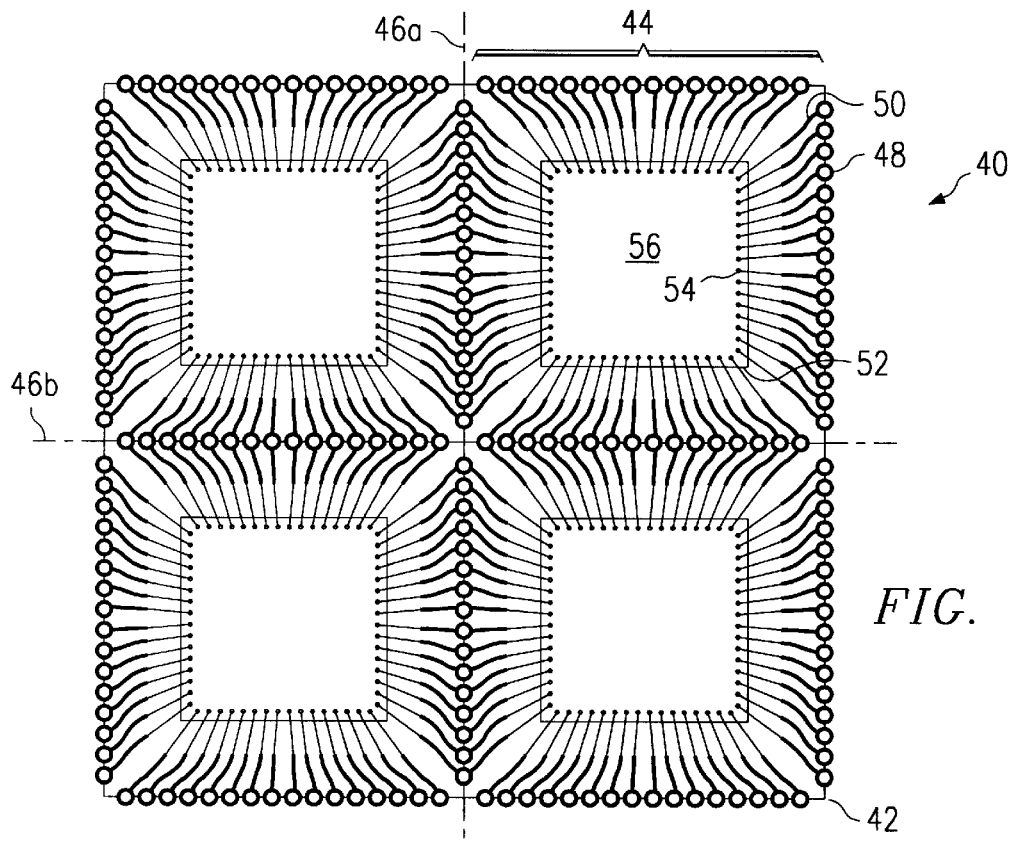
FIG. 3 is a top view of a substrate strip of the present invention.

Turning now to the present invention, FIG. 3 depicts a portion of a wrap-around interconnect strip 40. The wrap-around interconnect strip 40 is made of a circuit board or substrate 42. To produce the individual integrated circuit package substrate units 44, the interconnect strip 40 is cut by, e.g., a printed circuit board a router or saw. Cutting lines 46a and 46b show the position where the substrate 42 is separated to create the units 44.

Circular vias 48 that are or can be made electrically conductive are initially created surrounding the units 44 along cutting lines 46a and 46b. Positioning a circular via 48 on the edge between two of the units 44, allows for simultaneous connection of electric signals from the top surface to the bottom surface on each unit 44. Connection is achieved through the semi-circular cross-section vias resulting when the units 44 are separated. By positioning the circular vias 48 around the units 44, the space and adjacent solid waste that a necessary to create a circular via 48 and the space that it normally occupies (as depicted in the prior art) is eliminated.

While the strip 40 depicted in FIG. 3 is depicted as a 2 by 2 array, the present invention can be used to define individual units in a wide variety of arrays, depending on the size of the strip and the shape of each unit. In fact, the strip can have any shape, for example, square, rectangular, circular, triangular, and the like. The units and the arrays can, likewise, be of any shape depending on the structural needs of the designer, as will be known to those of skill in the art in light of the present disclosure.

In the present invention, open areas are also generally minimized, thereby increasing the number of units 44 that can be created per strip 40. The present invention can also decrease, and almost eliminate, the amount of waste created per strip 40 during substrate creation and processing by eliminating the wasted material needed to surround a via 15 as depicted in FIG. 1.

The substrate 42 can be made of any conventional medium to high temperature epoxy, such as BT resin, FR-4 or FR-5 available from Motorola, Inc., U.S.A., Mitsubishi, Japan or Allied Signal, U.S.A. The substrate 42 may also contain reinforcing fibers, such as glass fibers.

Extending from the circular vias 48 towards the central portion of the individual units 44 are signal traces 50. Wire bonding 52 connects one end of the signal traces 50 to bonding pads 54 on a silicon chip 56.

Figure 4:
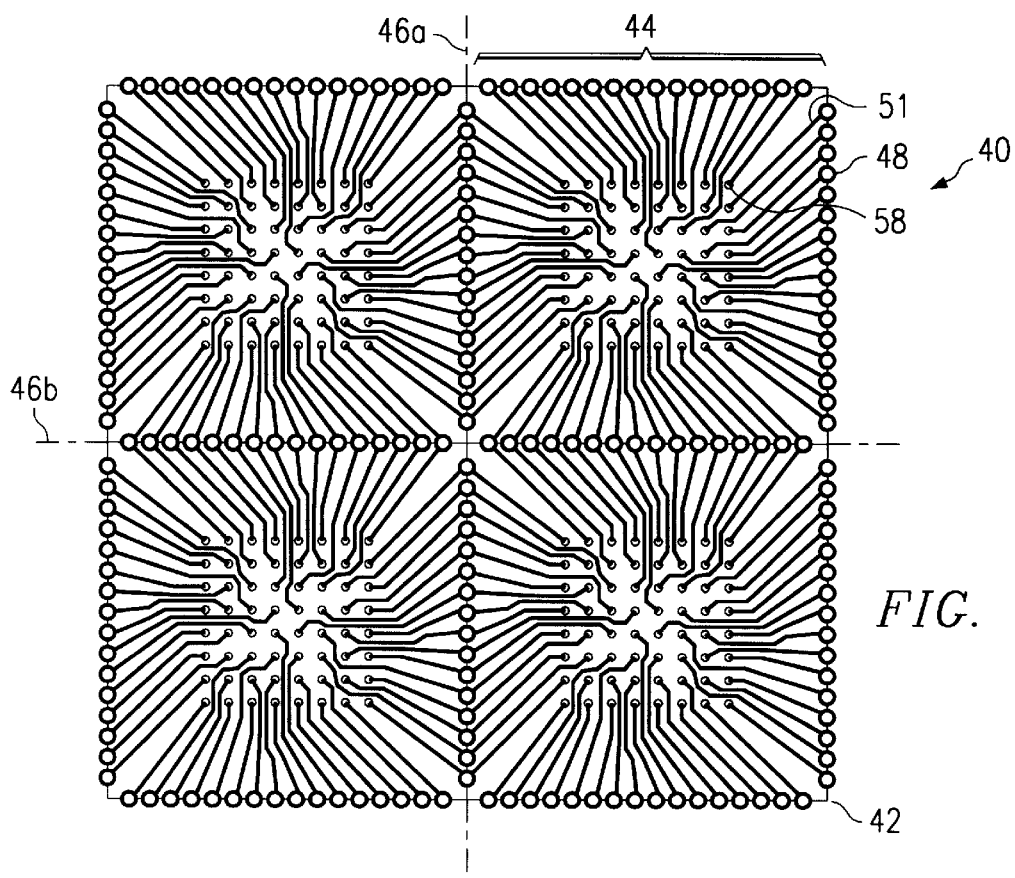
FIG. 4 is a bottom view of a substrate unit of the present invention.

FIG. 4 depicts a bottom view of the wrap-around interconnect strip 40. As with FIG. 3 depicted hereinabove, the circular vias 48 are depicted surrounding the individual units 44 of the substrate 42. Signal traces 50 connect the circular vias 48 to solder pads 58 to which solder balls (not depicted) can be attached. The wrap-around interconnect strip 40 is cut into individual units 44 along cutting lines 46a and 46b, which frees up the space normally occupied by the excess substrate 42.

The wrap-around interconnect for fine pitch BGA can be used, not only with pads having a pitch of 0.5 millimeters, but can also with more common pad pitches such as 1.27 millimeters. The line width of the signal traces or routing strips 51, can be, e.g., between 70 and 100 micrometers in width. In the embodiment, the circular vias 48 can be drilled having, e.g., a 300 to a 500 micrometer diameter. The solder land surrounding the circular via 48, on the other hand, can be anywhere from, e.g., 300 to 700 micrometers.

Alternatively, microvias having diameters of less than 300 micrometer diameters, such as photo-etched microvias, may be used to maintain the same routing density with the wrap-around interconnect apparatus and method of the present invention. The cost of producing the individual substrates is greatly increased when using microvias. Cost increases are due to the increased number of etching, cutting and plating steps needed to create the microvias.

The present invention addresses the problems caused when using microvias. The wrap-around interconnected method can be used when etching operation create the individual vias, each cutting operation is twice as efficient because half the circular vias are needed to create each substrate unit.

Figure 5:
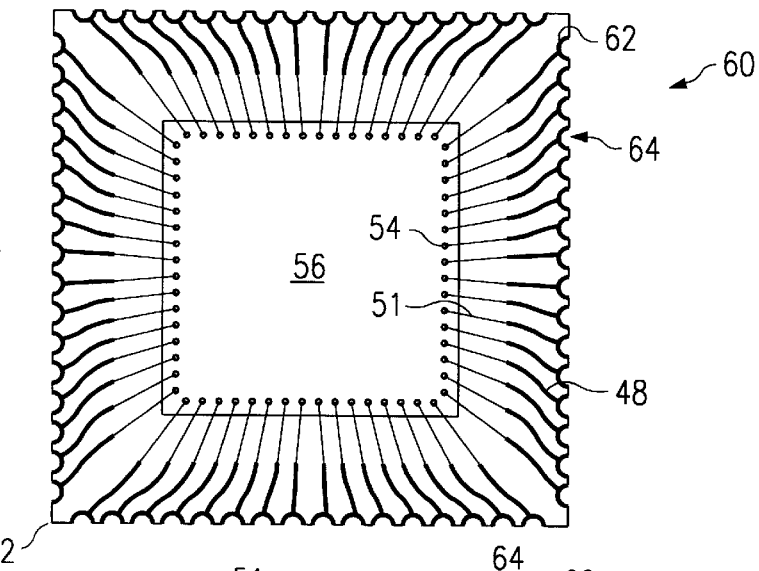
FIG. 5 is a top view of a substrate unit of the present invention.

FIG. 5 shows a top view of an individually cut wrap-around interconnect substrate, designated generally as 60. Here the individual units depicted in FIGS. 3 and 4 have been separated using, e.g., a printed circuit board or substrate saw. The semi-circular or "half" vias 62 are shown having an opening 64 that is generally a semi-circular cylindrical cross-section. In the semi-circular vias 62, the conductive material is disposed along the semi-circular cylindrical cross-section created by separating the circular via 48 generally in half (less any material removed during cutting) that results from the lengthwise cutting of the circular via 48.

The semi-circular vias 62 do not occupy any usable space within the signal routing region of the substrate. Thereby, the space can be used by the chip and the signal routing. Due to the better space utilization of the semi-circular vias 62, the amount of electrical connections between the top and the bottom of the substrate 42 are increased, as is the total length of traces per unit area.

Figure 6:
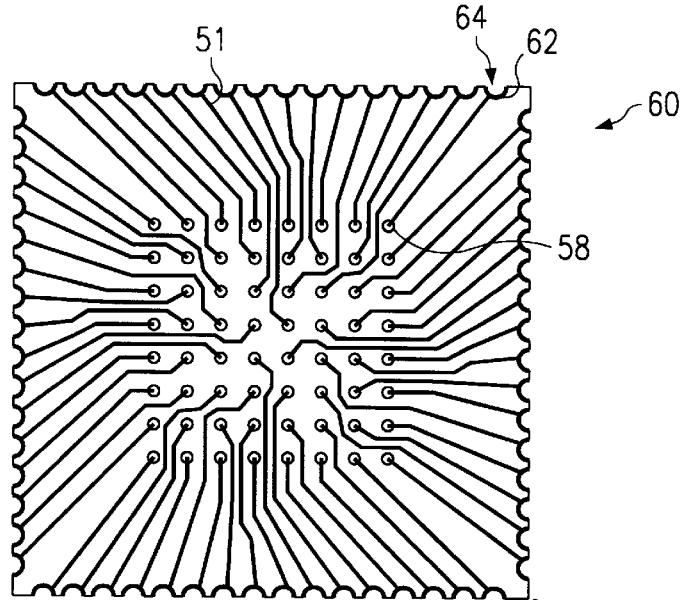
FIG. 6 is a bottom view of a substrate unit of the present invention.

FIG. 6 shows a detailed view of the bottom side of the wrap-around interconnect substrate 60 also depicted having semi-circular vias 62 with opening 64. The semi-circular vias 62 are connected to signal traces or routing strips 51 and to solder pads 58.

Figure 7:
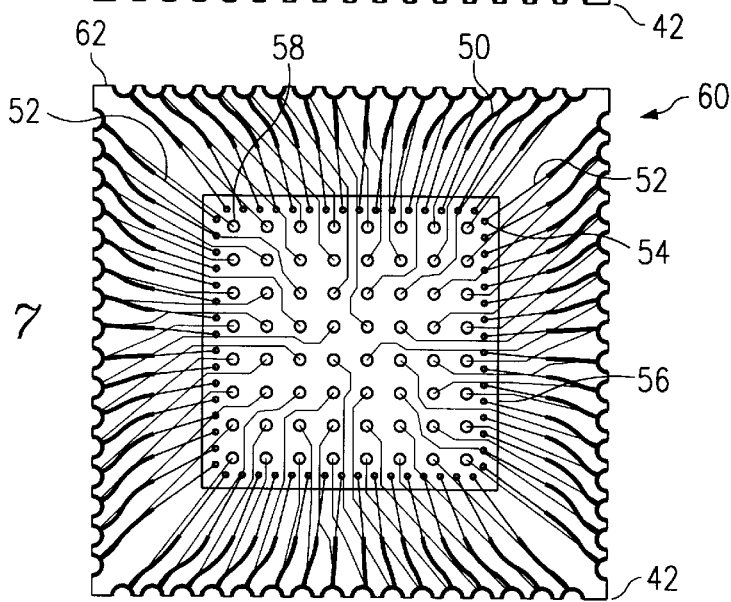
FIG. 7 is a see-through view of an integrated circuit using the present invention.

FIG. 7 shows a combined see-through view of the wrap-around interconnect substrate 60 with all of the appended electrical connections. A silicon chip 56 having bonding pads 54 is electrically connected by wire bonding 51 to the signal traces 50. The signal traces 50 arrive at the semi-circular vias 62 where the electrical connection traverses the plane of the substrate 42 to arrive at the bottom of the substrate 42. On the bottom side of the substrate 42, the semi-circular vias 62 transfer the electrical current to routing strips 51 on the bottom side of the substrate 42 which travel to the solder pads 58. The solder pads 58 can be electrically connected by, for example, solder balls (not depicted) to a mother or sister board (also not depicted).

The present invention can increase the efficiency of integrated circuit packaging by decreasing the number of drilling operations required to create circular vias 48 in a substrate 42. The circular vias 48 can electrically interconnect the surfaces, and even integral layers within the substrate 42, thereby increasing the usable area of a substrate 42 by minimizing the surface area necessary to create these circular vias 48. These circular vias 48 are created in a region away from the routing area.

Also, the present invention can greatly decrease the amount of packaging by-products and waste created during the processing operation. The present invention also takes advantage of current packaging, manufacturing and processing equipment, thereby eliminating the need to re-tool, saving money and resources, as well as extending the lifetime of current equipment.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit package, comprising:

a substrate having first and second surfaces and an edge;

a plurality of wire bond pads on a central portion of the first surface;

a first plurality of signal traces on the first surface extending outward from the wire bond pads to the edge;

a plurality of solder pads on a central portion of the second surface;

a second plurality of signal traces on the second surface extending outward from the solder pads to the edge; and one or more vias at the substrate edge extending between the first and the second surface of the substrate, wherein each via has a depth from the substrate edge of less than one half a width of a corresponding hole through the substrate and a second substrate prior to separation of the substrate from the second substrate each via containing conductive material connecting one of the first plurality of signal traces to one of the second plurality of signal traces.

2. The integrated circuit package of claim 1, wherein the substrate is a high temperature epoxy.

3. The integrated circuit package of claim 2, wherein the high temperature epoxy is mixed with glass fibers.

4. The integrated circuit package of claim 2, wherein the high temperature epoxy comprises a bismalimide triazine resin.

5. The integrated circuit package of claim 2, wherein the high temperature epoxy is FR-4.

6. The integrated circuit package of claim 2, further comprising:

a silicon chip attached to the first surface of the substrate, the silicon chip having one or more bonding pads; and wire bonding electrically connecting the bonding pads to the wire bond pads on the first surface of the substrate.

7. The integrated circuit package of claim 6, wherein the solder pads on the second surface form a ball grid array.

8. An integrated circuit substrate strip comprising:

two substrate units, each substrate unit having two major surfaces both in a common plane with a corresponding major surface of the other substrate unit and sharing at least one common boundary with the other substrate unit;

a plurality of wire bond pads on a central portion of a first major surface of each substrate unit;

a first plurality of signal traces on the first major surface of each substrate unit extending from the wire bond pads to the at least one common boundary;

a plurality of solder pads on a central portion of the second major surface of each substrate unit;

a second plurality of signal traces on the second major surface extending from the solder pads to the at least one common boundary; and one or more conductive vias between the major surfaces along the common boundary, a portion of each conductive via extending through one substrate unit and a remainder of the via extending through the other substrate unit, each conductive via electrically connecting one of the first plurality of signal traces to one of the second plurality of signal traces.

9. The integrated circuit substrate strip of claim 8, wherein the conductive vias each comprise a plated through hole.

10. The integrated circuit substrate strip of claim 8, wherein the vias are formed along one or more cutting lines for separation of the substrate units.

11. The integrated circuit substrate strip of claim 8, wherein the substrate is a high temperature epoxy.

12. The integrated circuit substrate strip of claim 11, wherein the high temperature epoxy is mixed with glass fibers.

13. The integrated circuit substrate strip of claim 12, wherein the high temperature epoxy comprises a bismalimide triazine resin.

14. The integrated circuit substrate strip of claim 12, wherein the high temperature epoxy is FR-4.

15. A printed circuit board, comprising:
   a plurality of integrated circuit substrates integrally formed in a single planar structure with major surfaces of each integrated circuit substrate in a common plane, each integrated circuit substrate having at least one common boundary with an adjacent integrated circuit substrate;
   a plurality of wire bond pads on a central portion of a first major surface of each integrated circuit substrate;
   a first plurality of routing strips on the first major surface of each integrated circuit substrate, each routing strip within the first plurality of routing strips extending outward from a wire bond pad to the common boundary with the adjacent integrated circuit substrate;
   an array of solder pads on a central portion of a second major surface of each integrated circuit substrate;
   a second plurality of routing strips on the second major surface of each integrated circuit substrate, each routing strip within the second plurality of routing strips extending outward from a solder pad to the common boundary with the adjacent integrate circuit substrate; and
   a plurality of vias formed along each common boundary between two integrated circuit substrates within the plurality of integrated circuit substrates, each via containing conductive material connecting one of the first plurality of routing strips on one of the two integrated circuit substrates to one of the second plurality of routine strips on the one integrated circuit substrate and one of the first plurality of routing strips on the other integrated circuit substrate to one of the second plurality of routing strips on the other integrated circuit substrate.

16. The printed circuit board of claim 15, wherein each of the plurality of vias comprises a plated through hole.

17. The printed circuit board of claim 16, wherein each common boundary between an integrated circuit substrate and an adjacent integrated circuit substrate within the plurality of integrated circuit substrates forms a cutting line for separation of the integrated circuit substrate and the adjacent integrated circuit substrate.

18. The printed circuit board of claim 17, wherein the integrated circuit substrate is separated from the adjacent integrated circuit substrate by cutting through each via and the conductive material within the via.

19. The printed circuit board of claim 18, wherein the conductive material within each via along each common boundary connects only one of the first plurality of routing strips on the integrated circuit substrate to one of the second plurality of routing strips on the integrated circuit substrate after separation of the integrated circuit substrate from the adjacent integrated circuit substrate.

* * * * *

UNITED STATES PATENT AND TRADEMARK OFFICE
CERTIFICATE OF CORRECTION

| | | |
|---|---|---|
| PATENT NO. | : 6,121,678 | Page 1 of 1 |
| APPLICATION NO. | : 08/994741 | |
| DATED | : September 19, 2000 | |
| INVENTOR(S) | : Anthony Chiu et al. | |

It is certified that error appears in the above-identified patent and that said Letters Patent is hereby corrected as shown below:

Claim 15, column 8, line 11, delete "routine" and replace with -- routing --.

Claim 17, column 8, line 19, delete "an" and replace with -- each --.

Claim 17, column 8, line 20, delete "an" and replace with -- the --.

Signed and Sealed this

Sixth Day of July, 2010

David J. Kappos
*Director of the United States Patent and Trademark Office*